US008241998B2

(12) United States Patent
Cayrefourcq

(10) Patent No.: US 8,241,998 B2
(45) Date of Patent: Aug. 14, 2012

(54) METHOD OF PRODUCING AN SOI STRUCTURE WITH AN INSULATING LAYER OF CONTROLLED THICKNESS

(75) Inventor: Ian Cayrefourcq, St. Nazaire les Eymes (FR)

(73) Assignee: Soitec, Bernin (FR)

( * ) Notice: Subject to any disclaimer, the term of this patent is extended or adjusted under 35 U.S.C. 154(b) by 139 days.

(21) Appl. No.: 12/515,484

(22) PCT Filed: Jan. 10, 2008

(86) PCT No.: PCT/IB2008/000087
§ 371 (c)(1),
(2), (4) Date: May 19, 2009

(87) PCT Pub. No.: WO2008/087527
PCT Pub. Date: Jul. 24, 2008

(65) Prior Publication Data
US 2010/0044830 A1 Feb. 25, 2010

(30) Foreign Application Priority Data
Jan. 16, 2007 (FR) ...................................... 07 52684

(51) Int. Cl.
*H01L 21/331* (2006.01)
(52) U.S. Cl. ........ 438/458; 438/455; 438/149; 438/295; 257/506; 257/E21.568; 257/E27.112
(58) Field of Classification Search .......... 257/347–354, 257/E29.287, E21.561–E21.57, E21.7–E21.704; 438/149–166, 295, 311, 404–413, 458–459, 438/479–481, 967
See application file for complete search history.

(56) References Cited

U.S. PATENT DOCUMENTS

| 5,374,564 A | 12/1994 | Bruel ............................ 438/455 |
| 6,882,013 B2 | 4/2005 | Nandakumar ................ 257/368 |
| 2005/0175789 A1* | 8/2005 | Helms, Jr. et al. ........... 427/457 |
| 2005/0215017 A1 | 9/2005 | Chen et al. .................... 438/301 |
| 2005/0239297 A1* | 10/2005 | Senzaki et al. ............... 438/785 |
| 2006/0035450 A1 | 2/2006 | Frank et al. .................. 438/585 |
| 2006/0091400 A1 | 5/2006 | Faure et al. .................... 257/76 |
| 2006/0246740 A1 | 11/2006 | Cartier et al. ................ 438/778 |
| 2006/0249790 A1* | 11/2006 | Chen et al. .................... 257/347 |

(Continued)

FOREIGN PATENT DOCUMENTS
EP 1 653 504 5/2006
(Continued)

OTHER PUBLICATIONS
International Search Report PCT/IB2008/000087 Dated Apr. 10, 2008.
(Continued)

*Primary Examiner* — Mamadou Diallo
(74) *Attorney, Agent, or Firm* — Winston & Strawn LLP

(57) ABSTRACT

The invention relates to semiconductor-on-insulator structure and its method of manufacture. This structure includes a substrate, a thin, useful surface layer and an insulating layer positioned between the substrate and surface layer. The insulating layer is at least one dielectric layer of a high k material having a permittivity that is higher than that of silicon dioxide and a capacitance that is substantially equivalent to that of a layer of silicon dioxide having a thickness of less than or equal to 30 nm.

17 Claims, 3 Drawing Sheets

U.S. PATENT DOCUMENTS

| | | | |
|---|---|---|---|
| 2006/0278937 A1* | 12/2006 | Kadoshima et al. | 257/384 |
| 2007/0080372 A1 | 4/2007 | Faure et al. | 257/201 |
| 2007/0087537 A1* | 4/2007 | Kadoshima et al. | 438/585 |
| 2007/0173033 A1 | 7/2007 | Allibert et al. | 438/455 |
| 2008/0067590 A1* | 3/2008 | Mise et al. | 257/347 |
| 2008/0099839 A1* | 5/2008 | Rachmady et al. | 257/347 |
| 2008/0149543 A1* | 6/2008 | Uemura et al. | 210/151 |
| 2012/0001296 A1* | 1/2012 | Herner | 257/530 |

FOREIGN PATENT DOCUMENTS

| | | |
|---|---|---|
| EP | 1 811 560 | 7/2007 |
| FR | 2 865 850 | 8/2005 |

OTHER PUBLICATIONS

T. Skotnicki et al., "A New Analog/Digital CAD Model for Sub-halfmicron MOSFETs", IEDM, vol. 94, (7.4.1-7.4.4) pp. 165-168, (1994).

Anurag Chaudhry et al., "Controlling Short-Channel Effects in Deep-Submicron SO1 MOSFETs for Improved Reliability: A Review", IEEE Transactions on Device and Materials Reliability, vol. 4, No. 1, pp. 99-109 (2004).

S. Zaouia et al., "Short-channel, narrow channel and ultra-thin oxide effects in advanced SOI MOFETS".

* cited by examiner

METHOD OF PRODUCING AN SOI STRUCTURE WITH AN INSULATING LAYER OF CONTROLLED THICKNESS

This application is a 371 filing of International Patent Application PCT/IB2008/000087 filed Jan. 10, 2008.

TECHNICAL FIELD AND PRIOR ART

The present invention relates to wafers, which are presented in the form of a thin slice presenting a layer in a semiconductor material (for example, silicon (Si), strained silicon (sSI), silicon-germanium (SiGe), or III-V materials) at the surface, called the "useful layer" constituting a support from which large quantities of components or circuits, particularly MOS ("Metal Oxide Semiconductor") transistors, may be made.

The increasing needs regarding integration density and electrical signal transferring speeds require ever smaller components or circuits to be made. However, the miniaturization of components may lead to the deterioration of some of their electrical characteristics. Thus, in the case of a MOS transistor with very small sizes, particularly relating to a reduction in gate length, the difference in potential between the source and the drain leads to the formation of an electrostatic field between these two elements, which interferes with the displacement of the carriers in the transistor (the length of the conduction channel approaches the source and drain depletion widths, leading to a strong reduction in threshold voltage and saturation current). These significant parasitic effects are called short channel effects, or SCE.

A solution to avoid these disadvantages consists of fabricating transistors on SOI ("Silicon On Insulator") silicon on insulator type structures, or more generally SeOI (semiconductor on insulator) type transistors, rather than on bulk silicon substrates in order to prevent or even remove the parasitic electrostatic fields. In fact, in a manner that is well known, SOI structures have a superficial active layer that is electrically separated from the bulk part of the substrate by a buried insulating layer, also called a "BOX" ("Buried Oxide Layer") in the case of a buried oxide layer. The insulating layer is typically made of an oxide such as $SiO_2$. By constraining electric fields, the insulating layer coupling between the source and the drain, thus promoting coupling between the gate and the transistor channel. FIG. 1 shows a CMOS transistor made from an SOI type structure comprising an active layer in silicon 120 in and on which are formed the source, drain and gate of the transistor, a buried insulating layer 122 ($SiO_2$) and a substrate in silicon 121.

However, as mentioned previously, for each new generation of components, the gate length is reduced and the capability of SOI structures to electrically insulate the different structures of the transistor and to reduce current leakage in the substrate must be improved by further reinforcing the coupling between the gate and the transistor channel. In an SOI type structure, coupling may be reinforced by reducing the thickness of the insulating layer. This has led to the development of SOI structures called "UTBOX" (Ultra Thin Buried Oxide), that is, SOI structures presenting an ultra thin buried insulating layer that may only reach several nanometers of thickness.

Nevertheless, when the thickness of the buried insulating layer is highly reduced in the SOI structure, the electrostatic field may pass into the bulk part of the structure below the insulating layer (in substrates 21 of FIG. 1). One solution to prevent current leakage due to the use of a very fine insulating layer consists of doping the bulk part of the structure by forming a ground plane by ionic implantation below the insulating layer to remove electrostatic fields and improve coupling. In this case, the thinner the insulating layer, the more the doping implantation step is facilitated (see the document T. Skotniki et al "A new analog/digital CAD model for sub-half micron MOSFETs", IEDM, 1994, pp 165-168).

Consequently, current solutions recommended to reduce short channel effects and other parasitic effects due to current leakage lead to reduce the thickness of the buried insulating layer in an SOI structure.

However, the fabrication of SOI or SeOI structures with thinner and thinner insulating layers leads to several problems. Indeed, one of the known technologies to manufacture SOI wafers is the Smart Cut™ technology. One example of implementation of Smart Cut™ technology applied to fabricate SOI wafers is particularly described in document U.S. Pat. No. 5,374,564 or in the article by A. J. Auberton-Hervé et al. entitled "Why can Smart-Cut Change the future of microelectronics?," Int. Journal of High Speed Electronics and Systems, Vol. 10, No 1, 2000, p. 131-146. In general, Smart Cut™ technology consists of implanting atomic species under a face of a semiconductor substrate (for ex., Si or SiGe), in an implantation zone, bonding, by molecular adhesion, the face of the substrate subjected to implantation with a support or receiving substrate, and then cleaving the donor substrate at the level of the implantation zone to transfer the part of the substrate situated between the surface subjected to implantation on the receiving substrate, and the implantation zone corresponding to the active layer in and on which the transistors are made. A buried insulating layer, for example in $SiO_2$, is previously formed on the donor substrate or the receiving substrate such as to be disposed in the resulting SOI structure between the part of the donor substrate transferred and the receiving substrate. Consequently, the insulating layer is at the level of the bonding interface between the donor substrate and the receiving substrate.

A too-large reduction of the thickness of the buried insulating layer deteriorates the bonding quality before detachment of the layer to transfer and leads to the appearance of defects (blisters, zones not transferred (ZNT), etc.) in the final structure. Indeed, it is known that, during a transfer, the higher the bonding energy between the donor substrate and the receiving substrate, the fewer defects in the resulting structure. In addition, with a very thin buried insulating layer, the diffusing species (gases for example) are not trapped in the thickness of the oxide layer and may be the origin of numerous defects within the structure.

In addition, three steps may be distinguished in molecular adhesion bonding, that is: the formation of Van Der Walls forces, the diffusion of water linked to consolidation of the interface, and the formation of covalent bonds. The reduction of the thickness of the dielectric layer makes the diffusion of water at the level of the interface, and thus consolidation of the interface, more difficult.

Lastly, a reduction of the thickness of the insulating layer leads to a reduction of the process window, meaning that it, involves the application of more restrictive ranges for the parameters implemented during the process, which leads to a reduction in the manufacturing yield.

Thus, in the case of SOI type structures manufactured according to Smart Cut™ technology, reducing the thickness of the buried insulating layer for reducing short channel effects is limited to a minimum thickness to allow good quality bonding and to limit the diffusion of species between the receiving substrate and the donor substrate.

SUMMARY OF THE INVENTION

To avoid the aforementioned disadvantages, the present invention proposes a solution that allows SOI or SeOI type structures to be made by Smart Cut™ technology with a buried insulating layer of a thickness sufficient to guarantee good bonding between a donor substrate and a receiving substrate and to absorb water molecules, while reducing parasitic effects and short channel effects.

For this purpose, the invention relates to a method of manufacturing a SOI or SeOI type structure by the transfer of a layer from a donor substrate onto a receiving substrate comprising:
a) a step of forming a buried insulating layer on the donor substrate and/or on the receiving substrate,
b) a step of ionic implantation of at least one species in the donor substrate intended to form a layer of microcavities or platelets,
c) a step of bonding the face of the donor substrate with a face of the receiving substrate by molecular adhesion,
d) a step of detachment of the layer in contact with the receiving substrate by cleaving at the level of the layer of microcavities or platelets formed in the donor substrate, a method in which, during step a), the insulating layer is made by forming at least one dielectric layer in a high k type material on the donor substrate or on the receiving substrate, the dielectric layer in a high k type material having a capacitance that is substantially equivalent to the capacitance of a layer of silicon dioxide ($SiO_2$) with a thickness that is less than or equal to 30 nm.

Thus, the use of a material for the insulating layer that has a higher dielectric constant than the material that is usually utilized for insulating layers in SOI or SeOI type structures, that is, in general, silicon dioxide, allows the coupling between the gate and the transistor channel to be reinforced without reducing too much the thickness of the insulating layer.

In fact, the theoretical formula of the capacitance C is written:

$$C = \frac{k\varepsilon_0 S}{e}$$

with k: dielectric constant (corresponding to the relative permittivity $\varepsilon r$), $\varepsilon 0$: permittivity of free space, S: surface of the insulating layer and e: insulating layer thickness.

It is observed that, by increasing permittivity by using a material with a higher dielectric constant k, the capacitance of the insulating layer is increased. Consequently, if a high k type material presenting a dielectric constant k that is greater than that of $SiO_2$ (which is 3.9) while conserving a capacitance substantially equivalent to the capacitance of a $SiO_2$ layer with a thickness of less than or equal to 30 nm is utilized in the insulating layer, it is clear that, for a constant insulating layer surface S, the thickness of the high k type layer must be higher than that of the $SiO_2$ layer.

Thus, by increasing the permittivity of the insulating layer, it is possible to conserve a sufficient insulating layer thickness to ensure good bonding and to minimize the appearance of defects in the transferred layer while minimizing short channel effects.

The high k type dielectric layer preferably presents a dielectric constant k at least higher than 5

The high k type dielectric layer material is chosen at least from:
AlN, $Si_3N_4$, $Al_2O_3$ (materials with k values between 5 and 10),
$ZrO_2$, $TiO_2$, $HfO_2$, $ZrSiO_4$, $Y_2O_3$, $La_2O_3$, $Gd_2O_3$, $Ta_2O_5$, $SiTiO_3$ (materials with k values between 10 and 50),
$BaTiO_3$, $SrTiO_3$, $BaTiO_3$, $(Ba,Sr)TiO_3$ (materials with k values greater than 50).

According to one aspect of the invention, the buried insulating layer presents a minimum thickness of at least approximately 10 nm.

According to one aspect of the invention, the dielectric layer in a high k type material is made by deposition or by epitaxy.

According to another aspect of the invention, the donor substrate is in a semiconductor material. In particular, it may be a substrate in silicon, or germanium, or silicon-germanium, or gallium nitride, or gallium arsenide or silicon carbide. It may also be ferromagnetic, piezoelectric and/or pyroelectric materials (for example $Al_2O_3$, $LiTaO_3$).

The invention also relates to a SOI or SeOI type structure comprising a thin layer, the structure furthermore comprising an insulating layer between the thin layer and the substrate, characterized in that the insulating layer comprises at least one dielectric layer in a high k type material having a capacitance that is substantially equivalent to the capacitance of a silicon dioxide layer with a thickness that is less than or equal to 30 nm.

Thus, with an insulating layer having a higher dielectric constant, a SOI or SeOI type structure is obtained in which coupling between the gate and the transistor channel is reinforced and the thickness of the insulating layer is sufficient to ensure a good connection by bonding between the semiconductor material layer and the substrate.

The high k type dielectric layer preferably presents a dielectric constant k that is at least higher than 5. The layer may in particular be made of a material chosen at least from AlN, $Si_3N_4$, $Al_2O_3$, $ZrO_2$, $TiO_2$, $HfO_2$, $ZrSiO_4$, $Y_2O_3$, $La_2O_3$, $Gd_2O_3$, $Ta_2O_5$, $SiTiO_3$, $BaTiO_3$, $SrTiO_3$, $BaTiO_3$, $(Ba,Sr)TiO_3$.

The insulating layer presents a thickness of at least approximately 10 nm.

The thin layer may be in a semiconductor material or in a ferromagnetic and/or piezoelectric and/or pyroelectric material.

BRIEF DESCRIPTION OF THE FIGURES

The characteristics and advantages of the present invention will emerge more clearly from the following description, made for indicative and non-limiting purposes, with regard to the appended drawings in which.

DETAILED DESCRIPTION OF EMBODIMENTS OF THE INVENTION

The present invention applies to any method for making SOI ("Silicon On Insulator") or SeOI ("Semiconductor On Insulator) type structures implementing at least the formation of an insulating layer on a donor substrate and/or on a receiving substrate, ionic implantation of the donor substrate to delimit a layer to transfer by an embrittlement plane, bonding of the implanted donor substrate on a receiving substrate and detachment of the layer to transfer from the donor substrate, as in Smart Cut™ technology.

The principle of the invention consists of forming an insulating layer with a higher permittivity than that presented by the thin insulating layers usually encountered in SOI type structures and particularly in $SiO_2$ layers. Indeed, the applicant has observed that by using an insulating layer with high permittivity in this type of structure, it is possible to have, with equivalent capacitance, a buried insulating layer with a thickness sufficient for facilitating and guaranteeing good bonding between the donor substrate of the layer to transfer and the receiving substrate while reducing parasitic effects due to current leakage, such as short channel effects in particular. Good bonding is obtained when the insulating layer is sufficiently thick to absorb water molecules in its thickness.

With reference to FIGS. 2A to 2E and 3, a method for transferring a layer in conformance with an embodiment of the invention is described.

Figure 2A:
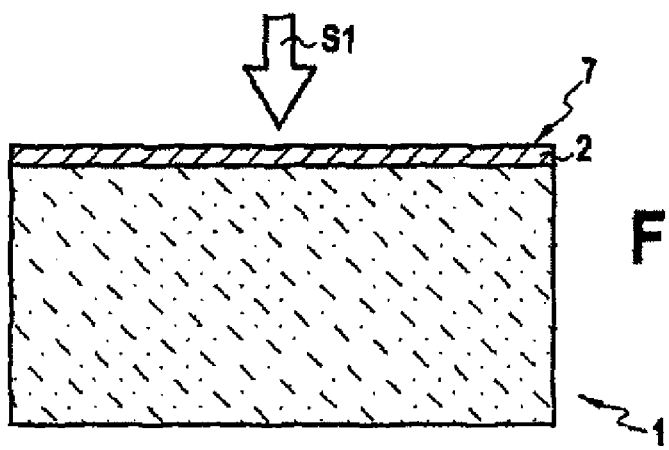
FIGS. 2A to 2E are schematic views in section showing the transfer of a layer of Si in conformance with an embodiment of the invention.

In this embodiment, the starting substrate or donor substrate 1 is constituted by a mono-crystalline silicon a wafer (FIG. 2A).

The first step (step S1) consists of forming an insulating layer with increased permittivity in relation with the oxide layers (for example $SiO_2$) usually used to form a buried oxide layer in an SOI type structure. For this purpose and in conformance with the invention, a "high k" type dielectric material is used to form the insulating layer, that is, a material whose dielectric constant k is higher than 5. The following materials, in particular, are among the high k type dielectric materials that may be used to make the insulating layer according to the invention: AlN, $Si_3N_4$, $Al_2O_3$, $ZrO_2$, $TiO_2$, $HfO_2$, $ZrSiO_4$, $Y_2O_3$, $La_2O_3$, $Gd_2O_3$, $Ta_2O_5$, $SiTiO_3$, $BaTiO_3$, $SrTiO_3$, $BaTiO_3$, $(Ba,Sr)TiO_3$. Any other type of dielectric material presenting a dielectric constant k higher than 5 may be adequate for forming an insulating layer according to the invention.

In conformance with the invention, the insulating layer is made by forming at least one dielectric layer in a high k type material having a capacitance that is substantially equivalent to the capacitance of a $SiO_2$ layer with a thickness that is less than or equal to 30 nm. By way of example, a layer of $Si_3N_4$ with a dielectric constant k of 7.5 must present a thickness of approximately 60 nm to confer to the insulating layer (with the same surface) a capacitance equivalent to that obtained with a layer of $SiO_2$ with a thickness of approximately 30 nm. According to another example, a layer of $Al_2O_3$ with a dielectric constant k of 11.5 must present a thickness of approximately 60 nm to confer to the insulating layer (with the same surface) a capacitance equivalent to that obtained with a layer of $SiO_2$ with a thickness of approximately 20 nm.

Figure 1:
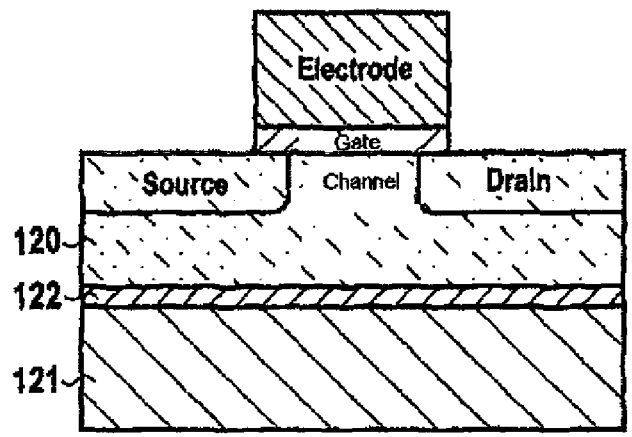
FIG. 1 shows a CMOS transistor made in a SOI type structure.

In the example described in FIG. 1A, an insulating layer 2 in a high k type material $TiO_2$ is formed on the donor substrate 1. However, the insulating layer 2 may be formed from any other type of high k type material mentioned previously. In addition, the insulating layer may also be formed on the receiving substrate or even on both the donor substrate and the receiving substrate. Moreover, in addition to the layer of high k type material, the insulating layer 2 may comprise additional layers of different materials such as interface/adhesion-promoting layers. In this case, the additional layer or layers must be considered when calculating the final thickness of the insulating layer and the value of the dielectric constant of the latter.

To ensure good quality bonding, the insulating layer 2 is formed with a sufficient thickness to ensure good bonding between the donor and receiving substrates, that is, a thickness of at least 10 nm.

The insulating layer 2 may be formed by deposition or by epitaxy. In a known manner, the technique used to form the insulating layer will depend on the high k type dielectric material to form and on the substrate on which the material must be formed.

Figure 2B:
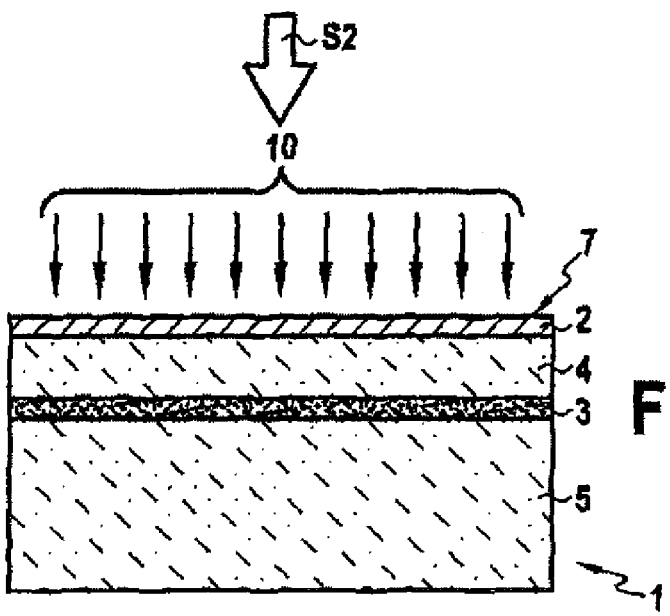

Once the insulating layer 2 is formed, the implantation step is performed in view of detaching the layer from the donor substrate 1 (step S2, FIG. 2B). In conformance with the well known Smart Cut™ technology, implantation or co-implantation 10, for example of helium and/or hydrogen (example: implantation of $H^+$ ions with an implantation energy of between 20 and 250 keV and an implantation dose of approximately between $3.10^{16}$ and $6.10^{16}$ atoms/$cm^2$), is carried out in the substrate to form an embrittlement zone 3 delimiting, on the one hand, a thin layer or film 4 in the upper region of the substrate 1 and, on the other hand, a portion 5 in the lower region of the substrate corresponding to the rest of substrate 1.

Figure 2C:
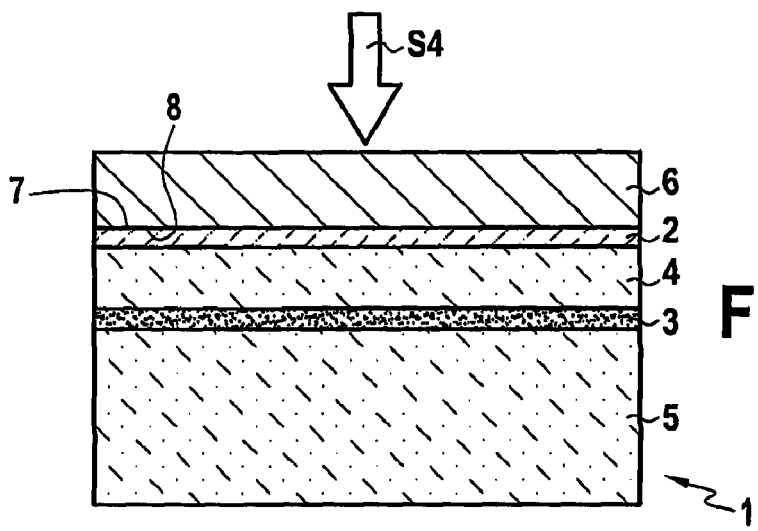

The donor substrate 1 is then bonded by molecular adhesion, on a receiving substrate 6, for example a silicon wafer (step S4, FIG. 2C). The principle of molecular adhesion bonding is well known and will not be described in further detail. As a reminder, molecular adhesion bonding is based on putting two surfaces in close contact, that is, without using a specific material (glue, wax, metal with a low melting point, etc.), the forces of attraction between the two surfaces being high enough to cause molecular adhesion (bonding induced by all of the forces of attraction (Van Der Waals forces) of electronic interaction between atoms or molecules of the two surfaces to bond).

To have bonding surfaces that are sufficiently smooth and free from particles and contaminants, surfaces 7 and 8 respectively of the receiving substrate and the donor substrate are cleaned before they are put in close contact (step S3).

A step of activating the bonding surfaces (plasma treatment, mechanical chemical polishing, etc.) to obtain good bonding energy may also be carried out before putting the surfaces in close contact.

After putting the two substrates in close contact, a thermal treatment to reinforce the bonding interface is carried out (step S5). This treatment may be performed in an inert (Ar or $N_2$) and possibly slightly oxidizing atmosphere.

Figure 2D:
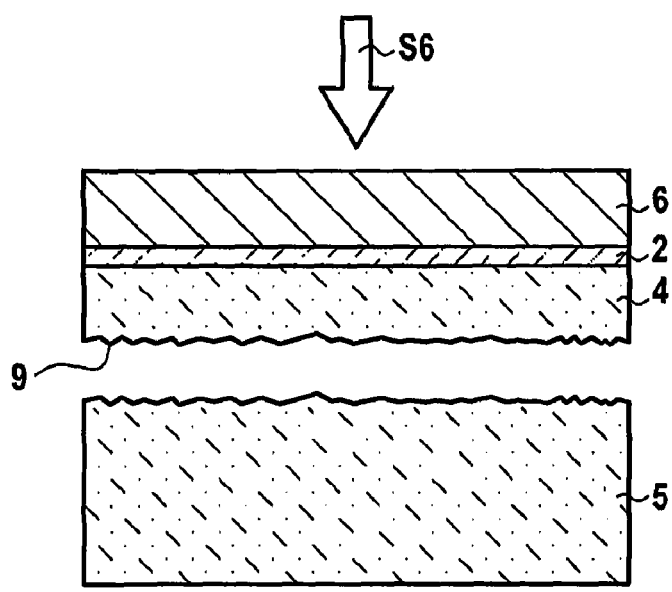

After the bonding step, the invention proceeds to detachment of layer 4 of substrate 1 by the application of a thermal or annealing treatment causing detachment stress resulting in cleavage of the substrate at the level of the embrittlement zone 3 (step S6, FIG. 2D).

The detachment stress may consist of the application of a thermal treatment and/or mechanical detachment stress such as, for example, the insertion of a blade at the level of the implanted ion concentration layer and/or the application of tensile forces and/or even the application of ultrasound or microwaves with adapted power and frequency.

Figure 2E:
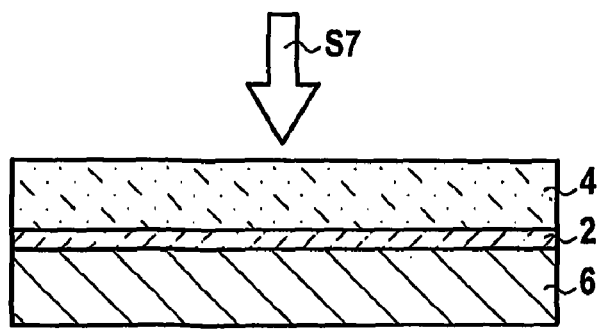
Figure 3:
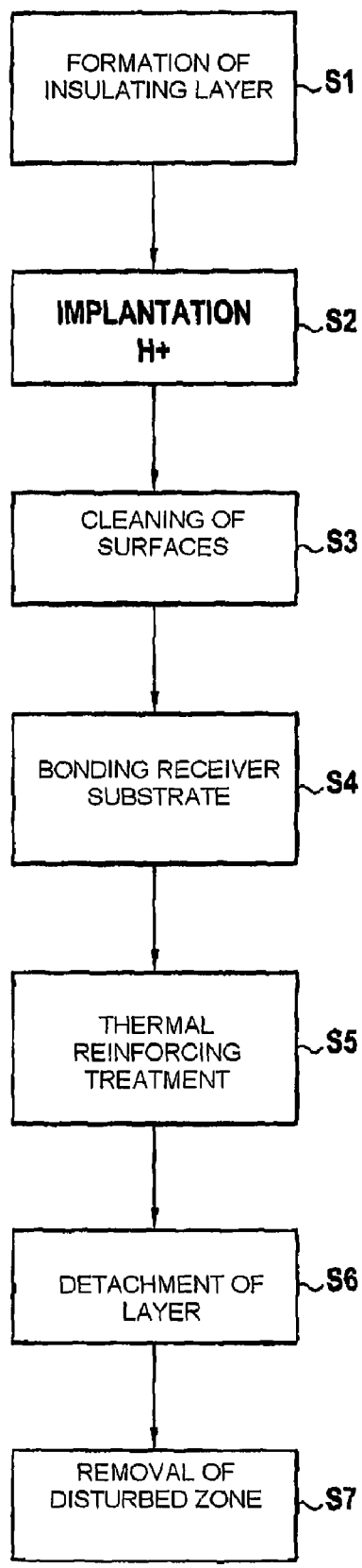
FIG. 3 is a flow chart of the steps implemented in FIGS. 2A to 2E.

A finishing step, for example by mechanical chemical polishing, is then carried out to eliminate the disturbed zone and to reduce the roughness level of the fractured surface 9 of transferred layer 4 (step S7, FIG. 2E). The disturbed zone may also be eliminated by selective chemical etching possibly followed by polishing to improve the surface roughness. A thermal treatment under hydrogen and/or argon may possibly be carried out alone or in combination with the polishing.

As represented in FIG. 2E, the structure obtained is a SOI or SeOI type structure comprising a thin layer 4 on a substrate 6, the structure moreover comprising an insulating layer 2 with high permittivity that is disposed between the layer 4 in a semiconductor material and the substrate 6 and which comprises at least one dielectric layer in a high k type material having a capacitance substantially equivalent to the capacitance of a layer of silicon dioxide with a thickness of less than or equal to 30 nm, as described previously.

According to a variation of embodiment, the high permittivity insulating layer may be formed not on the donor substrate but on the receiving substrate, a protection layer (of the $SiO_2$, $Si_3N_4$ or other type) is then formed on the donor substrate before the implantation step, the two substrates then being bonded to each other after optionally eliminating the protection layer on the donor substrate. The other steps of the method remain unchanged.

The invention claimed is:

1. A method of manufacturing an ultra-thin-buried-insulating-layer-type of semiconductor-on-insulator (SOI) structure having an insulating layer of increased permittivity and increased thickness but substantially equivalent capacitance in comparison to a buried layer of silicon dioxide in a conventional UTBOX SOI structure wherein the buried layer is less than 30 nm thick, which method comprises:

forming at least one dielectric layer of a high k material on either of a donor substrate or a receiving substrate or on both substrates, with the dielectric layer having a permittivity that is higher than that of silicon dioxide and having an increased thickness selected so that the capacitance of the dielectric layer is substantially equivalent to that of the buried layer of silicon dioxide in the conventional UTBOX SOI structure;

forming an embrittlement plane in the donor substrate that defines a thin, useful layer of the donor substrate for transfer to the receiving substrate;

bonding the donor and receiving substrates together at a bonding interface with the dielectric layer(s) positioned between the substrates; and detaching the thin, useful layer by cleaving at the embrittlement plane to form a semiconductor-on-insulator structure that has a buried insulating layer of the high k dielectric material.

2. The method according to claim 1, wherein the high k dielectric layer has a dielectric constant k that is at least greater than 5.

3. The method according to claim 2, wherein the high k material of the dielectric layer is AlN, $Si_3N_4$, $Al_2O_3$, $ZrO_2$, $TiO_2$, $HfO_2$, $ZrSiO_4$, $Y_2O_3$, $La_2O_3$, $Gd_2O_3$, $Ta_2O_5$, $SiTiO_3$, $BaTiO_3$, $SrTiO_3$, $BaTiO_3$, or $(Ba,Sr)TiO_3$.

4. The method according to claim 1, wherein the dielectric layer is formed on the substrate at a thickness sufficient to provide the buried insulating layer with a thickness of at least approximately 40 nm to at least 60 nm so that the buried insulator layer has the same capacitance as a layer of silicon dioxide that is 20 to 30 nm thick.

5. The method according to claim 1, wherein the dielectric layer is formed by deposition or by epitaxy, the forming of the embrittlement plane is accomplished by implanting at least one atomic species into the donor substrate, and the bonding is attained by molecular adhesion of bonding surfaces of the donor and receiving substrates.

6. The method according to claim 5, which further comprises activating the bonding surface of the donor substrate, the receiving substrate or of both substrates to enhance molecular bonding.

7. The method according to claim 5, wherein the high k dielectric layer is provided on the receiving substrate and which further comprises forming a protection layer on the donor substrate before implanting the atomic species.

8. The method according to claim 5, wherein the high k dielectric layer is provided on the donor substrate prior to implanting of the atomic species, and the donor substrate and thin, useful layer comprises a semiconductor, ferromagnetic, piezoelectric or pyroelectric material.

9. The method according to claim 8, wherein the donor substrate and thin, useful layer is silicon, germanium, silicon-germanium, gallium nitride, gallium arsenide, silicon carbide, $Al_2O_3$, or $LiTaO_3$.

10. The method according to claim 5, wherein the high k dielectric layer is provided on both the donor substrate and the receiving substrate and includes an additional layer of an adhesion-promoting material to facilitate bonding.

11. The method according to claim 1, which further comprises reinforcing the bonding interface by conducting a thermal treatment on the substrates prior to detaching.

12. The method according to claim 1, which further comprises polishing the transferred useful layer to reduce surface roughness.

13. A method of manufacturing a semiconductor-on-insulator structure having an insulating layer of increased permittivity and controlled thickness, which comprises:

forming at least one dielectric layer of a high k material on either of a donor substrate or a receiving substrate or on both substrates, with the dielectric layer having a capacitance that is substantially equivalent to that of a layer of silicon dioxide having a thickness of less than or equal to 30 nm, but with the dielectric layer having a thickness that is greater than that of the silicon dioxide layer;

forming an embrittlement plane in the donor substrate that defines a thin, useful layer of the donor substrate for transfer to the receiving substrate;

bonding the donor and receiving substrates together at a bonding interface with the dielectric layer(s) positioned between the substrates; and detaching the thin, useful layer by cleaving at the embrittlement plane to form a semiconductor-on-insulator structure that has a buried insulating layer of the high k dielectric material.

14. A method of improving a conventional SOI structure having an ultra-thin buried silicon dioxide layer (UTBOX) with a thickness less than or equal to 30 nm comprising:

selecting a thickness for an improved buried insulating layer comprising a high k dielectric material for an improved SOI structure, the thickness of the improved high-k insulating layer being greater than the thickness of the silicon-dioxide insulating layer in the conventional UTBOX SOI structure so that the improved high-k insulating layer and the conventional silicon-dioxide insulating layer have substantially equivalent capacitances; and producing an improved SOI structure having a buried insulating layer comprising the high k dielectric material, by forming at least one layer of the high k dielectric material on either of a donor substrate or a receiving substrate or on both substrates with the selected thickness, forming an embrittlement plane in the donor substrate that defines a thin, useful layer of the donor substrate for transfer to the receiving substrate;

bonding the donor and receiving substrates together at a bonding interface with the dielectric layer(s) positioned between the substrates; and detaching the thin, useful layer by cleaving at the embrittlement plane to form a semiconductor-on-insulator structure that has a buried insulating layer of the high k dielectric material.

15. The method of claim 1 wherein the thickness of the improved high-k insulating layer is selected to be proportional to the value of permittivity of the high-k material.

16. The method of claim 13 wherein the thickness of the improved high-k insulating layer is selected to be proportional to the value of permittivity of the high-k material.

17. The method of claim 14 wherein the thickness of the improved high-k insulating layer is selected to be proportional to the value of permittivity of the high-k material.

* * * * *